United States Patent
Loh et al.

(10) Patent No.: US 11,862,583 B2
(45) Date of Patent: Jan. 2, 2024

(54) SEMICONDUCTOR WAFER THINNED BY STEALTH LASING

(71) Applicant: Western Digital Technologies, Inc., San Jose, CA (US)

(72) Inventors: Chee Keong Loh, Batu Kawan (MY); Foo You Chow, Batu Kawan (MY); Ridzuan Hanapi, Batu Kawan (MY); Boon Soo Lim, Batu Kawan (MY)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/128,622

(22) Filed: Mar. 30, 2023

(65) Prior Publication Data

US 2023/0238338 A1    Jul. 27, 2023

Related U.S. Application Data (63) Continuation of application No. 16/933,177, filed on Jul. 20, 2020.

(51) Int. Cl.
*H01L 23/00* (2006.01)
*H01L 21/78* (2006.01)
*H01L 21/304* (2006.01)
*H01L 21/268* (2006.01)

(52) U.S. Cl.
CPC .......... *H01L 23/564* (2013.01); *H01L 21/268* (2013.01); *H01L 21/304* (2013.01); *H01L 21/78* (2013.01)

(58) Field of Classification Search
CPC ... H01L 23/564; H01L 21/268; H01L 21/304; H01L 21/78; H01L 2221/68336; H01L 21/6836; H01L 29/06; B23K 26/362
See application file for complete search history.

(56) References Cited

U.S. PATENT DOCUMENTS

| | | | |
|---|---|---|---|
| 8,361,883 B2 * | 1/2013 | Fukuyo | C03B 33/074 438/460 |
| 10,319,593 B2 | 6/2019 | Hirata et al. | |
| 10,388,526 B1 | 8/2019 | Seddon et al. | |
| 2004/0113283 A1 | 6/2004 | Farnworth et al. | |
| 2014/0225279 A1 | 8/2014 | Choi et al. | |
| 2017/0372965 A1 * | 12/2017 | Nishibayashi | H01L 29/1608 |
| 2018/0190621 A1 | 7/2018 | Yan et al. | |
| 2020/0058550 A1 * | 2/2020 | Ono | B23K 26/53 |

(Continued)

OTHER PUBLICATIONS

Preliminary Amendment dated Apr. 25, 2023 in U.S. Appl. No. 17/841,357.

(Continued)

*Primary Examiner* — Thanh T Nguyen
(74) *Attorney, Agent, or Firm* — Vierra Magen Marcus LLP (57) ABSTRACT

A semiconductor wafer thinned by a stealth lasing process, and semiconductor dies formed therefrom. After formation of an integrated circuit layer on a semiconductor wafer, the wafer may be thinned by focusing a laser at discrete points in the wafer substrate beneath the surface of the wafer. Upon completion of stealth lasing in one or more planar layers in the substrate, a portion of the substrate may be removed, leaving the wafer thinned to a desired final thickness.

20 Claims, 6 Drawing Sheets

(56) References Cited

U.S. PATENT DOCUMENTS

2021/0358786 A1* 11/2021 Yu .................... H01L 23/49513

OTHER PUBLICATIONS

Final Office Action dated Apr. 27, 2023 in U.S. Appl. No. 16/933,177.
Office Action dated Jan. 28, 2022 in U.S. Appl. No. 16/933,177.
Response to Office Action dated Apr. 22, 2022 in U.S. Appl. No. 16/933,177.
Final Office Action dated Aug. 5, 2022 in U.S. Appl. No. 16/933,177.
Response to Final Office Action dated Nov. 1, 2022 in U.S. Appl. No. 16/933,177.
Office Action dated Nov. 25, 2022 in U.S. Appl. No. 16/933,177.
Response to Office Action dated Feb. 27, 2023 in U.S. Appl. No. 16/933,177.

* cited by examiner

SEMICONDUCTOR WAFER THINNED BY STEALTH LASING

CLAIM OF PRIORITY

The present application is a continuation of U.S. patent application Ser. No. 16/933,177, entitled "SEMICONDUCTOR WAFER THINNED BY STEALTH LASING," filed Jul. 20, 2020, which application is incorporated by reference herein in its entirety.

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, cellular telephones and solid-state drives.

Wafers currently are shipped from the wafer fab with a typical thickness of 760 microns to prevent damage during transport, and then thinned once the individual semiconductor dies are defined within the wafer. In order to maximize storage capacity for a given form factor storage device, storage device semiconductor dies, and the wafers from which they are made, are being fabricated to ever-decreasing thicknesses. Currently, wafers are being thinned for example to 36 microns, 25 microns and thinner.

A popular method of thinning semiconductor wafers involves a backgrinding process where the back, inactive surface of the wafer is thinned using a number of grinding wheels while the front, active surface of the wafer is covered by protective tape and supported on a chuck. Conventional backgrinding processes have several disadvantages, including for example exerting forces on the wafer that may generate cracks, especially given the current fragile thicknesses of semiconductor wafers. Cracked dies have to be discarded, thus reducing yield. Moreover, detection of cracks also requires an additional screening/inspection step, adding to fabrication costs and processing time. Conventional backgrinding processes further generate debris and foreign materials that can also cause cracks and otherwise impair the dies on the wafers.

DETAILED DESCRIPTION

The present technology will now be described with reference to the figures, which in general, relate to a semiconductor wafer thinned by a stealth lasing process, and semiconductor dies cut therefrom. After formation of an integrated circuit layer on a semiconductor wafer, the wafer may be thinned by focusing a laser at discrete points in the wafer substrate beneath the surface of the wafer. The discrete focal points of the laser are provided in one or more planes parallel to the front and back surfaces of the wafer. Upon completion of stealth lasing in one or more planar layers in the substrate, a portion of the substrate may be removed, leaving the wafer thinned to a desired final thickness. In embodiments, the wafer may then undergo a polishing step, and may thereafter be diced into individual semiconductor dies.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
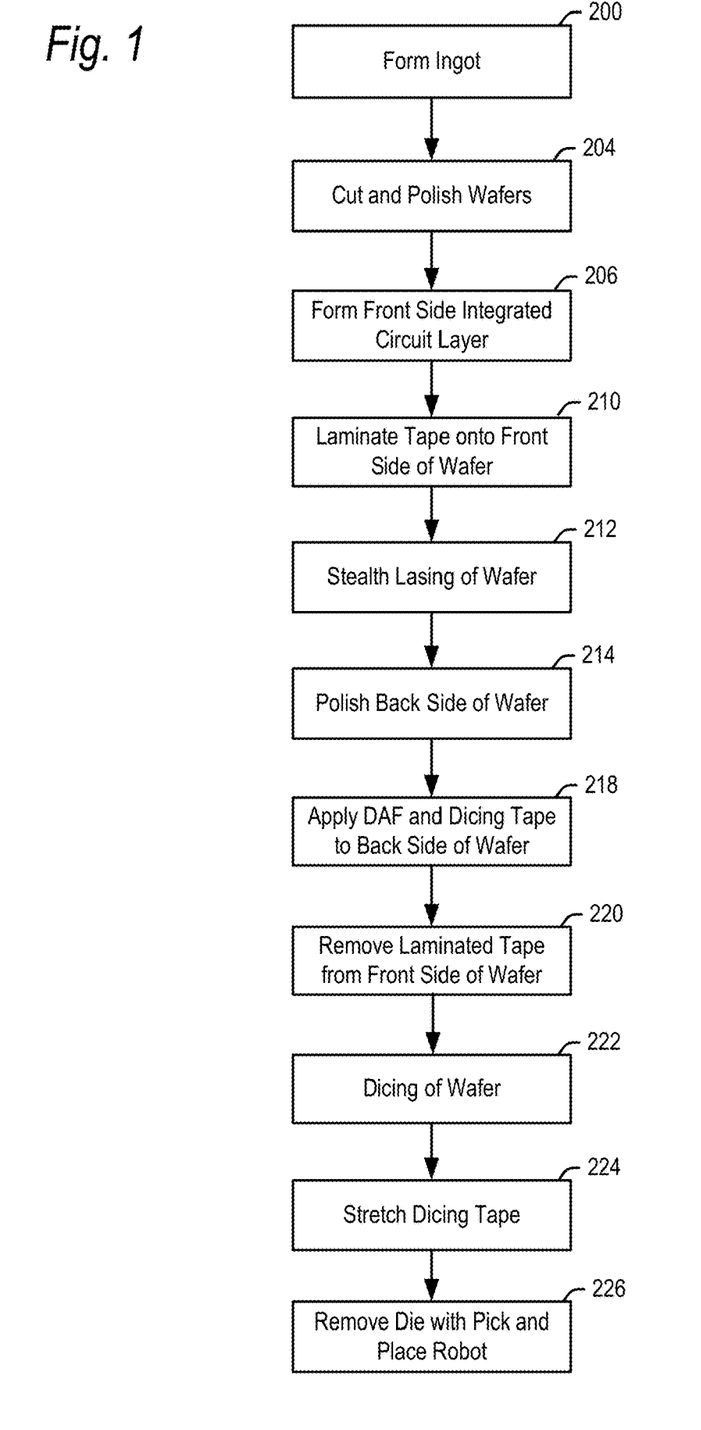
FIG. 1 is a flowchart for forming a semiconductor wafer and semiconductor dies according to embodiments of the present technology.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±5 um An embodiment of the present technology will now be explained with reference to the flowchart of FIG. 1, and the views of FIGS. 2-10. Referring initially to the flowchart of FIG. 1, a semiconductor wafer 100 may start as an ingot of wafer material, which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 204, the semiconductor wafer 100 may be cut from an ingot and polished on both the first major surface 102 (FIG. 2), and second major surface 104 (FIG. 4) opposite surface 102, to provide smooth surfaces. In step 206, the first major surface 102 may undergo various processing steps to divide the wafer 100 into respective semiconductor dies 106 (one of which is numbered in FIG. 2), and to form integrated circuits of the respective semiconductor dies 106 on and/or in the first major surface 102.

Figure 3:
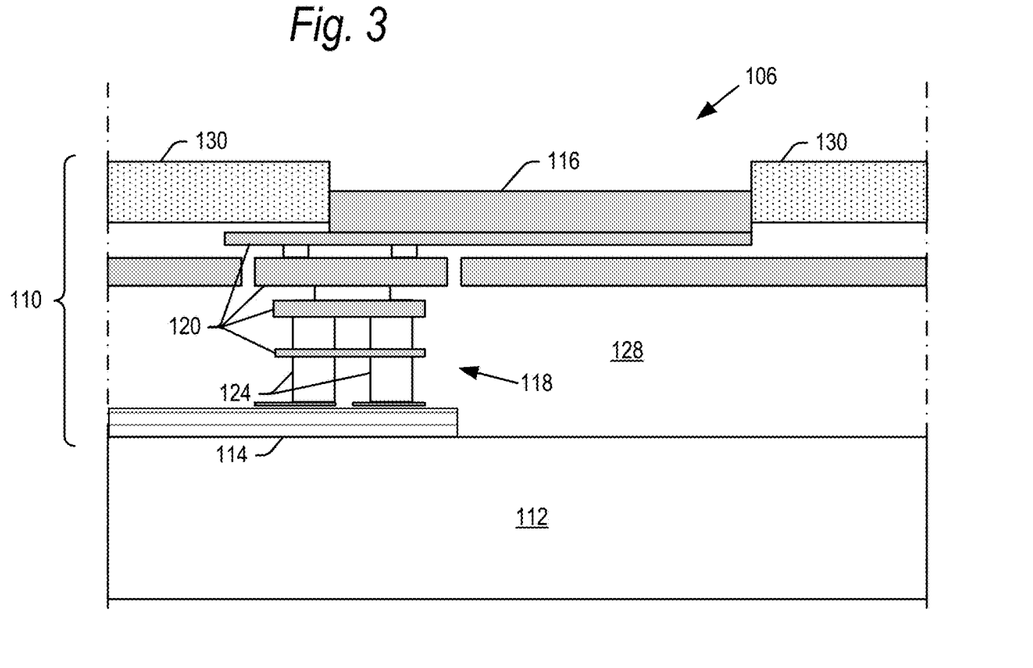
FIG. 3 is an enlarged cross-sectional edge view showing the circuit layer within a semiconductor die.
Figure 4:
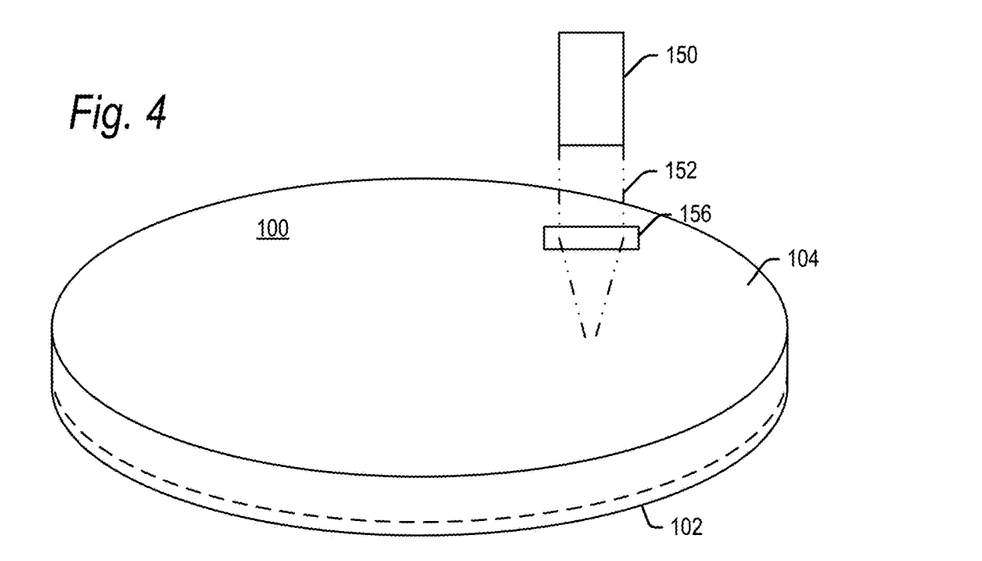
FIG. 4 is a perspective view of a stealth lasing process for thinning a semiconductor wafer according to embodiments of the present technology.

FIG. 3 is a cross-sectional side view of an exemplary semiconductor die 106 of the wafer 100 showing the integrated circuit layer 110 formed in a silicon substrate 112. Integrated circuit layer 110 may in general include integrated circuits 114 electrically coupled to surface die bond pads 116 by metallization layers 118. The integrated circuits 114 may be formed by various processes including for example deposition, patterning and doping of metals, metal oxides and silicon.

After formation of the integrated circuits 114, metallization layers 118 may be defined including metal interconnects 120 and vias 124 layered sequentially in a dielectric film 128. As is known in the art, the metal interconnects 120, vias 124 and dielectric film 128 may be formed for example by damascene processes a layer at a time using photolithography and thin-film deposition. The metal interconnects 120 and vias 124 may be used to form conductive nodes for transferring signals and voltages between the die bond pads 116 and integrated circuits 114. A passivation layer 130 may be formed on top of the upper dielectric film layer 128. The passivation layer 130 may be etched to expose the die bond pads 116.

In embodiments, the semiconductor dies 106 may for example be flash memory dies such as 2D NAND flash memory or 3D BiCS (Bit Cost Scaling), V-NAND or other 3D flash memory, but other types of dies 106 may be used. These other types of semiconductor dies include but are not limited to RAM, a controller, an SOC (system on a chip), a processor or other types of semiconductor dies.

It is known to create a single integrated memory die module comprised of a first semiconductor die including the memory array, and a second semiconductor die including the logic circuit such as CMOS integrated circuits. An example of such an integrated memory die module is disclosed in Published U.S. Patent Application No. U.S. 2019/0341375, entitled "Bifurcated Memory Die Module Semiconductor Device." Dies 106 may further be from a wafer of such bifurcated memory array semiconductor dies, or from a wafer of such bifurcated CMOS logic circuit dies.

Figure 2:
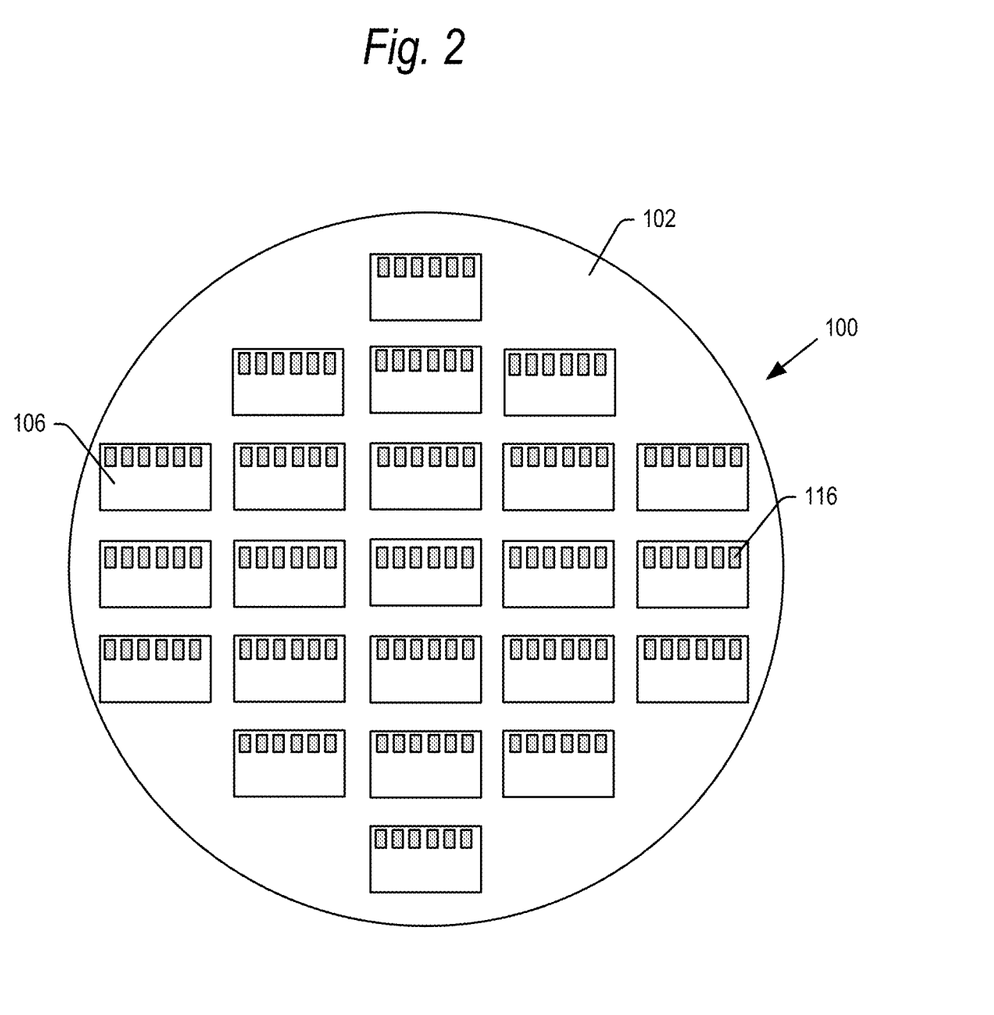
FIG. 2 is a front view of a semiconductor wafer showing a first major surface of the wafer.

The number of dies 106 shown on wafer 100 in FIG. 2 is for illustrative purposes, and wafer 100 may include more semiconductor dies 106 than are shown in further embodiments. Similarly, the number of bond pads 116 on each semiconductor die 106 is shown for illustrative purposes, and each die 106 may include more die bond pads than are shown in further embodiments.

After formation of the integrated circuit layer 110 in step 206, a layer of tape may be laminated onto the active, major surface 102 in step 210. The wafer 100 may then be turned over and thinned in step 212. In accordance with aspects of the present technology, the second surface may be lased by performing a stealth lasing step to thin the wafer as will now be explained with reference to FIGS. 4-9. Referring to the perspective view of FIG. 4, the wafer 100 may be supported on a chuck or other support surface (not shown) with the laminated active surface 102 facing the chuck and the second major surface 104 facing upward. A laser 150 may then emit a pulsed laser beam 152 at a wavelength that transmits through the second major surface 104 of the wafer 100, for example at infrared or near-infrared wavelengths. The pulsed laser beam may be focused to a point beneath the wafer's surface 104 using an optical system, for example including one or more collimating lenses 156.

Figure 5:
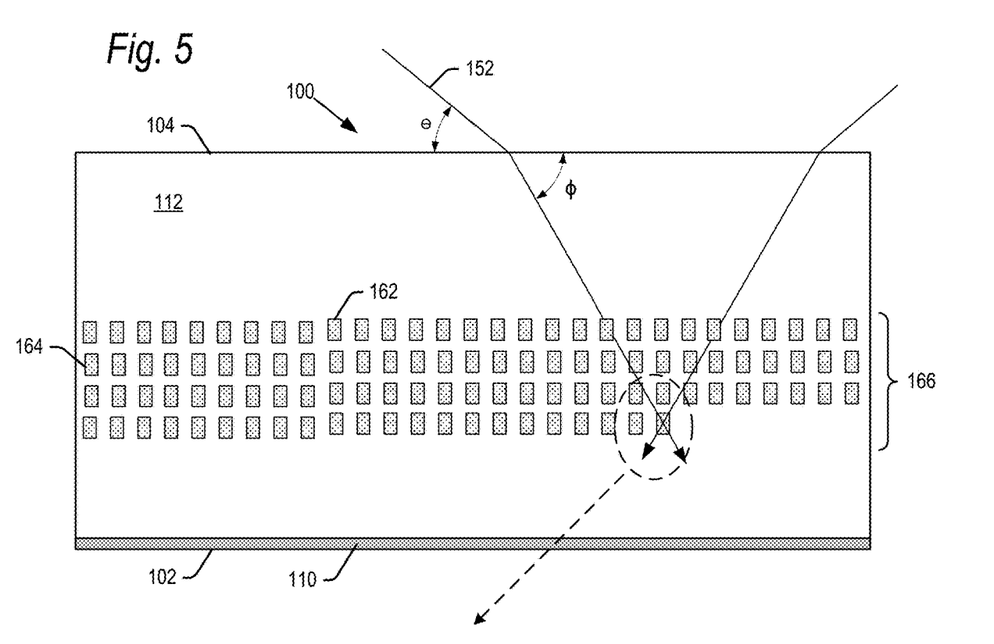
FIG. 5 is a cross-sectional view a stealth lasing process for thinning a semiconductor wafer according to embodiments of the present technology.
Figure 6:
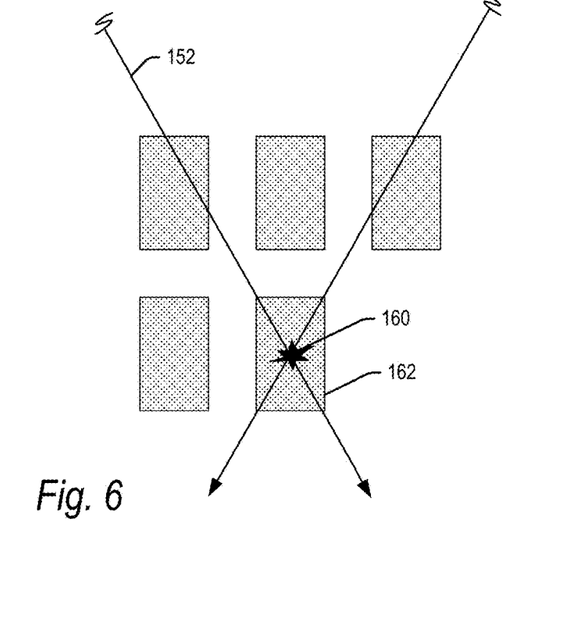
FIG. 6 is an enlarged cross-sectional view of a section of a wafer undergoing a stealth lasing process for thinning a semiconductor wafer according to embodiments of the present technology.

Referring now to the cross-sectional edge view of FIG. 5, when the laser beam 152 hits the second major surface 104, the beam refracts due to light in the laser beam slowing as it passes into the silicon substrate 112. The amount of refraction may vary depending on the refractive index of the substrate 112 material. FIG. 6 is an enlarged view of a section of substrate 112 within the dashed oval of FIG. 5. As shown in FIGS. 5 and 6, the collimating lens 154 causes the beam 152 to converge to a focal point 160 where the energy of the laser beam 152 is most concentrated. When the laser beam 152 hits a peak power density at the focal point 160, the substrate 112 absorbs the energy, and the area around the focal point is vaporized, creating a void 162 around the focal point.

In particular, as the beam 152 converges above the focal point 160, and diverges below the focal point 160, the beam will be sufficiently concentrated, and the energy high enough, above and below the focal point to vaporize the substrate material along a predefined height. That height is shown by H in the perspective view of a single void 162 in FIG. 7. In the laser beam 152 above and below the void 162, the energy of the laser beam 152 is sufficiently defocused so as to leave the substrate 112 intact. The void 162 will also have a diameter, D, which is a function of the void height, H, and the convergence angle of the laser beam 152 in the substrate 112, after refraction.

Figure 7:
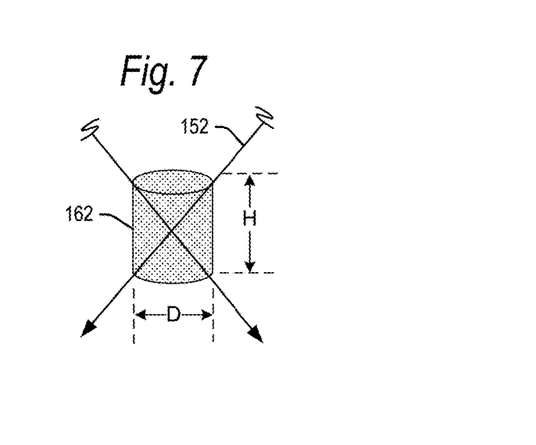
FIG. 7 is a perspective view of a single laser focus zone created by a stealth lasing process for thinning a semiconductor wafer according to embodiments of the present technology.

The dimensions H and D of a void 162 may be controlled by a variety of factors, including laser 150 peak power intensity, laser beam 152 diameter, the convergence angle created by the collimating lens 156 and the angle of refraction of the substrate 112. The peak power and beam area together define the peak power density of laser 150:

Peak power density $W/m^2$ = peak power (W)/beam area $(m^2)$.

In one example, the peak power of laser 150 may be 2 W, and the beam diameter≈2~4 μm. These values are by way of example only, and may vary in further embodiments.

In one example, the collimating lens 156 may create an angle of convergence, θ, of laser beam 152 of ~50°. This angle may change upon entering the substrate 112 to a refractive angle, φ, of ~80°. The angle of refraction will depend on the incoming collimating lens angle θ, and the relative permittivity, $ε_r$, of the substrate 112. In embodiments, the substrate 112 may have a relative permittivity, εr, of between 11.0 and 12.0. These angles and relative permittivity values are by way of example only, and may vary in further embodiments.

With such parameters, the void 162 may have a height, H, of 1.4~2 μm, and a diameter, D, of 2~4 μm. Again, these dimensions are by way of example only. Moreover, while the void 162 is shown as being generally cylindrical in FIG. 7, the voids 162 may have other shapes in further embodiments, including ovoid, spherical, or a combination of cylindrical, ovoid and/or spherical.

Referring again to FIG. 5, the voids 162 may be formed in one or more planar layers 164. The one or more planar layers of voids define a modified zone 166 in the wafer substrate 112 where the wafer will separate upon completion of the stealth lasing process. The planar layers 164 in the modified zone 166 may be parallel to each other and the first and second major surfaces 102, 104 of the wafer 100. In one example, there may be four layers 164 of voids 162 formed, but there may be 1 layer, 2 layers, 3 layers or more than 4 layers in further embodiments. A higher number of layers facilitates easier separation of the substrate 112.

The position of each layer 164 relative to the second planar surface 104 may be controlled by a variety of parameters, including the peak power density of the laser 150, the height of the collimating lens 156 above surface 104, and the collimator and refractive angles, θ and φ. Examples of the laser peak power density, collimator angle and refractive angle are provided above. With the above parameters being constant, the height of each layer 164 beneath the surface 104 of wafer 100 (also referred to as the defocus height) may vary by changing a position of the collimating lens 156 above the surface. In examples, the collimating lens 156 may move between 181 μm and 186 μm above the surface 104 of wafer 100 to create the different layers 164.

Another parameter which may be controlled when performing the stealth lasing step 212 is the spacing between voids 162 in a layer 164. A pattern of higher density voids 162 will remove more material from the modified zone 166 where the voids are formed making it easier to separate the substrate 112. Spacing between voids 162, also referred to as pulse interval, is given by:

Pulse interval (μm)=laser feed rate (mm/s)/laser pulse frequency (kHz).

In one example, the laser 150 may move at a rate of 300 mm/s relative to the surface 104 of wafer 100, and the pulse frequency may be 90 kHz. Thus:

Pulse interval≈3.3 μm.

It is understood that the feed rate may be other values, such as for example 250 mm/s, and the pulse frequency may be other values, in further examples.

Figure 8:
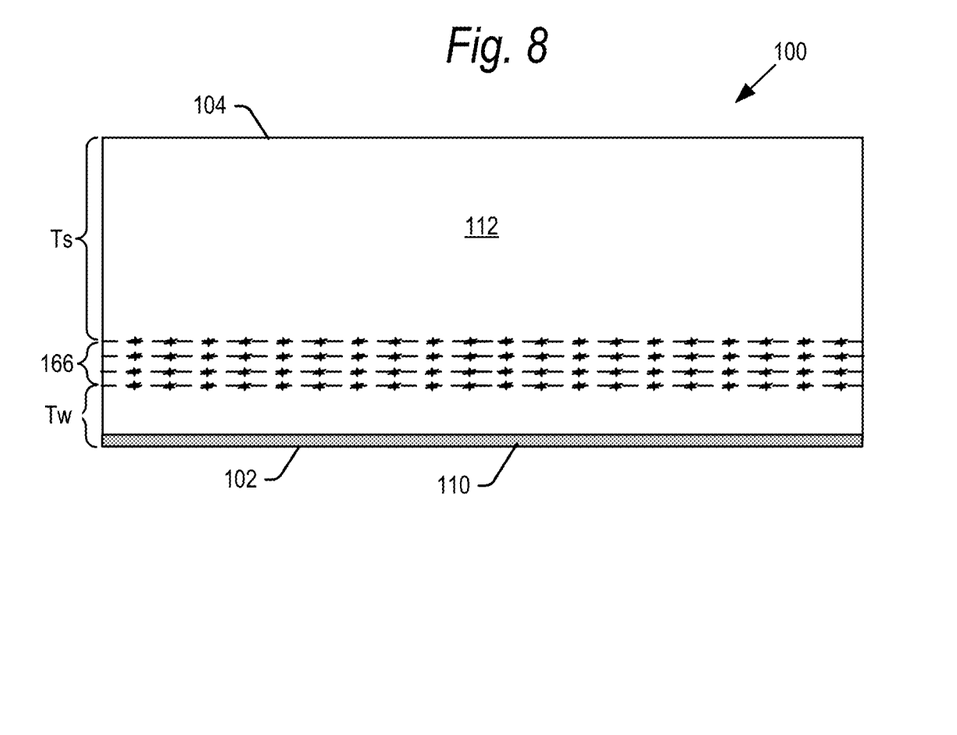
FIG. 8 is an edge view of a wafer after a stealth lasing process according to embodiments of the present technology.

FIG. 8 is an edge view showing the wafer 100 after the laser 150 has formed the multiple layers 164 of the modified zone 166 in the substrate 112. In one example, the wafer may have a total thickness of 760 μm. The modified zone 166 may be about 20-25 um thick. In one example, the thickness, Tw, of the finished wafer may be 32 μm. Thus, the thickness, Ts, of the removed substrate 112 may be between 703 μm and 708 μm. Again, these values are by way of example only and each may vary in further embodiments. For example, the thickness of the finished wafer 100 may be 25 μm or thinner. Where the finished wafer 100 is 25 μm, the thickness of the removed substrate, Ts, may be between 710 μm and 715 μm.

Figure 9:
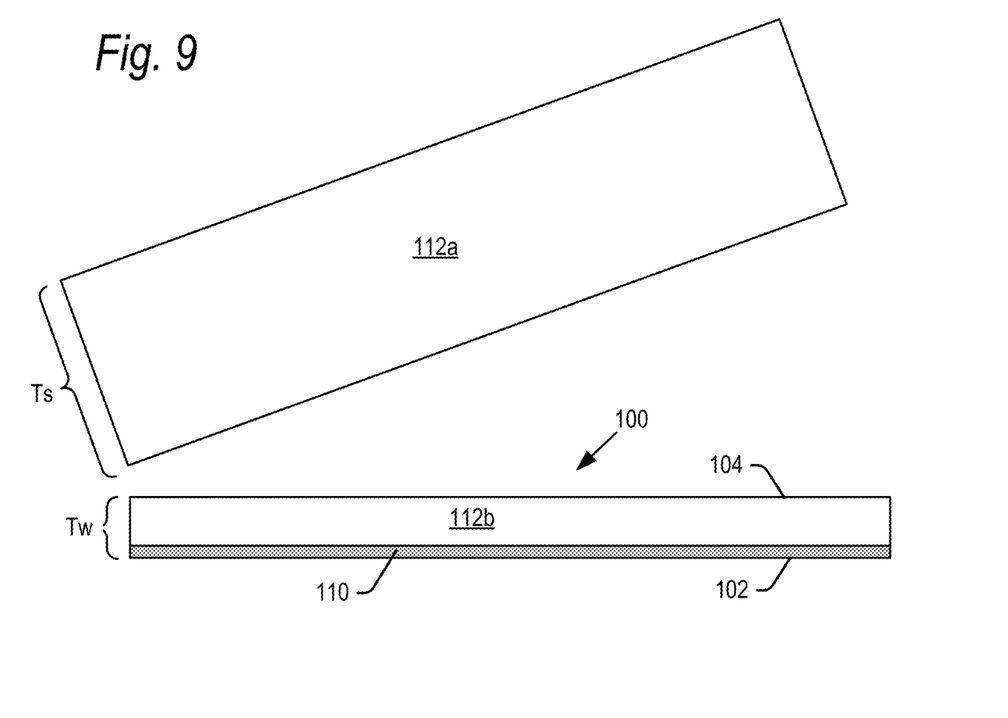
FIG. 9 is an edge view of thinned wafer and removal of a substrate layer of the wafer according to embodiments of the present technology.

FIG. 9 is an edge view showing removal of a portion of the substrate 112, specifically portion 112a, at the modified zone 166 after the stealth lasing step 212. A portion of the substrate 112, specifically substrate 112b, remains as part of the wafer 100. The portion 112a that was severed may be discarded. The new second major (back) surface 104 is the surface of substrate 112a defined by removal of the portion 112b.

In embodiments, after stealth lasing step 212, the back surface 104 may undergo a polishing step 214, using for example a Z3 polishing wheel rotating against the back surface. In further embodiments, it is conceivable that the parameters of stealth lasing step 212 be controlled such that polishing step 214 may be omitted.

After completion of the stealth lasing step 212 and polishing step 214 (where included), a layer of die attach film (DAF) adhered to a flexible dicing tape may be applied onto the second major surface 104 of the wafer 100 in step 218. The wafer 100 may then be turned over and supported on a chuck or other support surface, and the lamination tape on the active, first major surface 102 of the wafer 100 may be removed in step 220.

Thereafter, the wafer 100 may be diced in step 222. Dicing of the wafer may be performed for example using a known cutting blade. It is also known to dice wafers using a stealth dicing process in which a laser forms layers of voids in vertical planes (orthogonal to surfaces 102, 104) around the outline of each semiconductor die 106 in wafer 100. The stealth dicing process is distinguishable from the stealth lasing process of the present technology to thin the wafer in several respects. For example, stealth dicing may use a narrow diameter beam which forms impact points in vertical planes of the wafer. The stealth dicing impact points do not cut the wafer. Instead, after creation of the impact points, stresses on the wafer are generated which propagate the impact points along vertical crystalline planes to sever the individual semiconductor dies. Other dicing methods may be used.

After dicing step 222, the flexible dicing tape may be stretched along orthogonal axes to separate the individual semiconductor dies 106 in step 224. Thereafter, in step 226, individual semiconductor dies 106 may be removed by a pick and place robot for inclusion in a semiconductor package.

Stealth lasing to thin the wafer 100 as described above provides several advantages. As noted in the Background, conventional backgrinding processes may generate cracks in semiconductor wafers, especially those that are currently made at thin, fragile thicknesses. Stealth dicing according to the present technology eliminates wafer cracking due to the backgrinding processes. Elimination of such cracks improves wafer and die yields, and does away with the need for additional screening/inspection steps. Additionally, conventional backgrinding processes generate debris and foreign materials that can cause cracks and otherwise impair the assembly process. Elimination of the backgrinding process prevents the generation of this debris and foreign material, thus further improving yield and die quality. Moreover, the multiple backgrinding wheels needed for conventional wafer thinning add significant time, expense and complexity to the packaging process. Omission of the backgrinding wheels in accordance with the present technology improves each of these packaging parameters.

It is a further advantage of the present technology that the laser beam 152 has sufficiently diverged, or defocused, by the time it reaches the integrated circuit layer 110. Thus, the stealth lasing may be provided to thin the wafer without damaging the integrated circuit layer 110.

Figure 10:
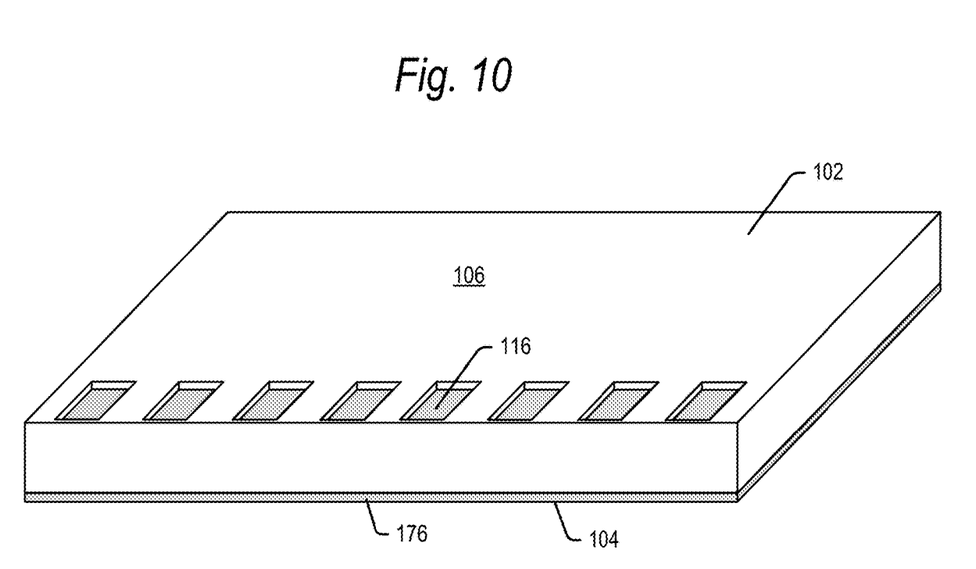
FIG. 10 is a perspective view of a die cut from a wafer thinned by a stealth lasing process according to embodiments of the present technology.

FIG. 10 shows an exemplary semiconductor die 106 after separation from wafer 100. The die 106 includes die bond pads 116 at the first major surface 102 of the die 106. The die 106 includes a lased, second major surface formed by the stealth lasing process described above. A DAF layer 176 is also shown on the second major surface 104.

In summary, an example of the present technology relates to a semiconductor die, comprising: a first major surface; a plurality of integrated circuits formed in the first major surface of the wafer; a lased, second major surface opposed to the first major surface; a die attach film layer covering the lased, second major surface.

In another example, the present technology relates to a semiconductor wafer, comprising: a first major surface; a plurality of semiconductor dies, the plurality of semiconductor dies comprising integrated circuits formed in the first major surface of the wafer; and a lased, second major surface opposed to the first major surface.

In a further example, the present technology relates to a semiconductor wafer, comprising: a first major surface; a plurality of semiconductor dies, the plurality of semiconductor dies comprising integrated circuits formed in the first major surface of the wafer; a second major surface opposed to the first major surface; wherein the second major surface is defined by means for severing a first portion of the wafer from a second portion of the wafer.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of processing a semiconductor wafer comprising semiconductor dies, the semiconductor wafer having an active surface, the method comprising:
   forming a modified zone within an interior of the semiconductor wafer, the step of forming the modified zone comprising the step of applying a laser to focus at multiple points within the interior of the semiconductor wafer to form multiple voids within the modified zone; and
   separating the semiconductor wafer at the modified zone into a first portion and a second portion, the first portion comprising the active surface and a second surface at the modified zone opposite the active surface, the first portion comprising the semiconductor wafer.

2. The method of claim 1, further comprising the step of polishing the second surface.

3. The method of claim 1, wherein the step of applying a laser to focus at multiple points within an interior of the semiconductor wafer comprises the step of applying the laser to focus in a pattern of discrete points at one or more planar layers within the semiconductor wafer.

4. The method of claim 3, wherein the step of applying the laser to focus in a pattern of discrete points at one or more planar layers within the semiconductor wafer comprises the step of applying the laser to focus in a pattern of discrete points at one or more planar layers that are parallel to the active surface of the wafer.

5. The method of claim 3, wherein the step of applying the laser to focus in a pattern of discrete points at one or more planar layers within the semiconductor wafer comprises the step of applying the laser to focus in a pattern of discrete points at two to four planar layers within the semiconductor wafer.

6. The method of claim 1, wherein the step of forming multiple voids comprises the step of forming multiple voids with a spacing from each other controlled by a speed with which the wafer moves relative to the laser and a pulse frequency of the laser.

7. The method of claim 1, wherein the step of forming multiple voids comprises the step of forming multiple voids having a height above and below the focal point of the laser, and a diameter, the height and diameter of the voids being controlled by a peak power intensity of the laser, a diameter of the laser, a convergence angle of the laser and an angle of refraction of the laser through a surface of the wafer through which the laser penetrates.

8. The method of claim 1, wherein the step of forming a modified zone within an interior of the semiconductor wafer further comprises passing the laser through an optical system comprising one or more collimating lenses.

9. The method of claim 8, wherein the step of forming a modified zone within an interior of the semiconductor wafer comprises the step of forming the modified zone at a controlled depth within the wafer by controlling a peak power density of the laser, a height of the one or more collimating lenses above a surface of the wafer through which the laser penetrates, a convergence angle of the laser and an angle of refraction of the laser through the surface of the wafer.

10. The method of claim 8, wherein the step of applying a laser to focus at multiple points within an interior of the semiconductor wafer comprises the step of applying the laser to focus in a pattern of discrete points at a plurality of planar layers within the semiconductor wafer, a spacing of the plurality of layers from each other controlled by varying a height of the one or more collimating lenses above the surface of the wafer through which the laser penetrates.

11. The method of claim 1, wherein the step of separating the semiconductor wafer at the modified zone into a first portion comprises the step of separating the semiconductor wafer at the modified zone so that the first portion has a thickness of between 25 microns and 36 microns.

12. The method of claim 1, wherein the step of forming integrated circuits of the semiconductor dies in the active surface comprises the step of forming flash memory integrated circuits in the active surface.

13. A method of thinning a semiconductor wafer comprising semiconductor dies, the semiconductor wafer having an active surface, the method comprising:
   forming one or more layers of multiple voids within an interior of the semiconductor wafer by applying a laser to converge at multiple focal points in the one or more layers where an energy of the laser is concentrated, and
   separating the semiconductor wafer into a first portion and a second portion at the one or more layers of multiple voids, the first portion comprising the active surface.

14. The method of claim 13, further comprising the step of polishing a surface of the first portion opposite the active surface.

15. The method of claim 13, further comprising the step of applying a die attach film to a surface of the first portion opposite the active surface.

16. The method of claim 13, wherein the step of forming one or more layers of multiple voids within an interior of the wafer comprises the step of forming between one and four layers parallel to the active surface of the wafer.

17. The method of claim 13, wherein the step of forming one or more layers of multiple voids within an interior of the wafer further comprises passing the laser through an optical system comprising one or more collimating lenses.

18. The method of claim 17, wherein the step of forming one or more layers of multiple voids within an interior of the semiconductor wafer further comprises the step of forming the one or more layers of multiple voids at a controlled depth within the semiconductor wafer by controlling a peak power density of the laser, a height of the one or more collimating lenses above a surface of the semiconductor wafer through which the laser penetrates, a convergence angle of the laser and an angle of refraction of the laser through the surface of the semiconductor wafer.

19. A method of fabricating flash memory semiconductor dies from a semiconductor wafer, the method comprising:

receiving the semiconductor wafer, the semiconductor wafer having flash memory integrated circuits formed in an active surface of the semiconductor wafer and the semiconductor wafer thinned by the steps of:

forming one or more layers of multiple voids within an interior of the semiconductor wafer parallel to the active surface of the semiconductor wafer by applying a laser to converge at multiple focal points in the one or more layers, and separating the semiconductor wafer into a first portion and a second portion at the one or more layers of multiple voids, the first portion comprising the active surface; and dicing the flash memory semiconductor dies from the semiconductor wafer.

20. The method of claim 19, wherein the step of dicing the flash memory semiconductor dies from the semiconductor wafer comprises the step of forming a second set of one or more layers of multiple voids within an interior of the wafer perpendicular to the active surface of the wafer by applying a laser to converge at multiple focal points in the second set of one or more layers.

\* \* \* \* \*